United States Patent
Li et al.

(10) Patent No.: US 9,635,792 B2
(45) Date of Patent: Apr. 25, 2017

(54) DIE-POSITIONING DEVICE, DIE-POSITIONING SYSTEM HAVING THE SAME, AND DIE-POSITIONING METHOD OF LED DISPLAY BOARD

(71) Applicant: Lextar Electronics Corporation, Hsinchu (TW)

(72) Inventors: Zong-Han Li, New Taipei (TW); Liang-Ta Lin, Guishan Township (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 501 days.

(21) Appl. No.: 14/041,599

(22) Filed: Sep. 30, 2013

(65) Prior Publication Data

US 2014/0130340 A1   May 15, 2014

(30) Foreign Application Priority Data

Nov. 15, 2012 (TW) .............................. 101142610 A (51) Int. Cl.
*H05K 13/04* (2006.01)
*H01L 21/67* (2006.01)
*B65G 47/84* (2006.01)
*H01L 23/00* (2006.01)
*H01L 33/00* (2010.01)

(52) U.S. Cl.
CPC ... *H05K 13/0408* (2013.01); *H01L 21/67144* (2013.01); *H01L 24/95* (2013.01); *B65G 47/848* (2013.01); *H01L 24/75* (2013.01); *H01L 33/0095* (2013.01); *H01L 2224/7598* (2013.01); *H01L 2224/75745* (2013.01); *H01L 2924/12041* (2013.01); *Y10T 29/49002* (2015.01); *Y10T 29/53174* (2015.01); *Y10T 29/53191* (2015.01)

(58) Field of Classification Search
CPC ............ B65G 47/848; H01L 21/67132; H01L 21/67144; H05K 13/0408; H05K 13/0452; H05K 13/0478; H05K 13/0482; Y10T 29/53191; Y10T 29/53174
See application file for complete search history.

(56) References Cited

U.S. PATENT DOCUMENTS 6,364,089 B1 *  4/2002  Singh ................... B65G 47/848
                                                        198/403

FOREIGN PATENT DOCUMENTS

NL   WO 03065421 A1 *  8/2003  ........... B65G 47/848
TW       200906633 A      2/2009

* cited by examiner

*Primary Examiner* — Livius R Cazan
(74) *Attorney, Agent, or Firm* — Moser Taboada (57) ABSTRACT

A die-positioning device includes a roller body, a plurality of die-suction portions, and at least one gas control device. The roller body includes a plurality of chambers therein, and the chambers are separated from each other. The die-suction portions are located on the surface of the roller body in columns. The die-suction portions for each column correspond to one of the chambers, and each of the die-suction portions has a die suction region and a gas channel that passes through the die suction region. The gas control device is connected to the chambers and disposed on the roller body. The gas control device selectively sucks the air from a specific chamber, such that each of the die-suction portions on the specific chamber sucks an LED die by the corresponding gas channel.

22 Claims, 14 Drawing Sheets

DIE-POSITIONING DEVICE, DIE-POSITIONING SYSTEM HAVING THE SAME, AND DIE-POSITIONING METHOD OF LED DISPLAY BOARD

RELATED APPLICATIONS

This application claims priority to Taiwan Application Ser. No. 101142610, filed Nov. 15, 2012, which is herein incorporated by reference.

BACKGROUND

Technical Field

The present disclosure relates to a die-positioning device, a die-positioning system having the same, and a die-positioning method of an LED display board.

Description of Related Art

During the manufacture of light emitting diodes, when placing LED dies on a substrate, since the dies are small and have large quantity, it is not easy to arrange the dies one by one on a substrate manually. Therefore, automatic equipment having a suction nozzle array is often used to suck the dies and release the dies on a display region of the substrate, so that the product yield rate and production capacity can be improved.

Plural suction nozzles are arranged to form the suction nozzle array, and the nozzles may be made of tungsten steel. If a high image quality for the display with the substrate having the dies is desired, the suction nozzle array needs to precisely align with the positions of the substrate at which the dies are to be placed. After the nozzles suck the dies, the dies can be released on the corresponding positions of the substrate. A conventional method for ensuring precise relative positions among the nozzles, the dies, and the substrate relates to the utilization of physical positioning holes.

However, although the physical positioning holes can be used to perform an alignment function, when two or more different types of dies need to be arranged on the substrate, the different types of dies need to be arranged on a die film first, after which the nozzles may suck the dies. Therefore, the usability of the physical positioning holes is limited.

SUMMARY

An aspect of the present invention is to provide a die-positioning device for positioning a plurality of dies on at least one die-disposing region of a substrate.

According to an embodiment of the present invention, a die-positioning device includes a roller body, a plurality of die-suction portions, and at least one gas control device. The roller body includes a plurality of chambers therein, and the chambers are separated from each other. The die-suction portions are located on a surface of the roller body in columns. The die-suction portions for each column correspond to one of the chambers, and each of the die-suction portions has a die suction region and a gas channel that passes through the die suction region. The gas control device is connected to the chambers and disposed on the roller body. The gas control device selectively sucks the air from a specific chamber, such that each of the die-suction portions on the specific chamber sucks an LED die by the corresponding gas channel. When the gas control device stops sucking the air from the specific chamber, the sucked die is released to a predetermined position.

In an embodiment of the present invention, the die-positioning device further includes a clamping element connected to two ends of the roller body for driving the roller body to rotate.

In an embodiment of the present invention, the roller body includes a gas transmission pipe and a plurality of baffle boards. The gas transmission pipe is located in the roller body for communicating the gas control device and the chambers. The baffle boards are located in the roller body and surround the gas transmission pipe with intervals therebetween to form the chambers.

In an embodiment of the present invention, the gas control device is located on an end of the roller body.

In an embodiment of the present invention, the gas control device includes a pump.

In an embodiment of the present invention, the die-positioning device further includes a position check mark fixed on the roller body.

In an embodiment of the present invention, the die-suction portions protrude from the surface of the of the roller body.

In an embodiment of the present invention, the die-positioning device further includes a plurality of solenoid valves. Each of the solenoid valves is disposed between each one of the chambers of the roller body and the gas channels of the die-suction portions corresponding to the chamber.

An aspect of the present invention is to provide a die-positioning system for positioning a plurality of LED dies on at least one die-disposing region of a substrate.

According to an embodiment of the present invention, a die-positioning system includes a conveyor device, a die supply device, and a die-positioning device. The conveyor device is for transmitting the substrate. The die supply device is for providing the dies that are to be predeterminedly positioned on the substrate. The die-positioning device is rotatably located above the conveyor device for sucking to the dies that are on the die supply device and releasing the dies on the die-disposing region of the substrate.

In an embodiment of the present invention, the dies include light emitting diode (LED) dies having at least three different colors.

In an embodiment of the present invention, the dies with different colors are any three of red, green, blue, and yellow LED dies.

In an embodiment of the present invention, the die-positioning device includes at least three roller bodies. Each of the roller bodies is for sucking to the LED dies with one of the colors and releasing the LED dies on a predetermined position of the substrate.

An aspect of the present invention is to provide a die-positioning method of an LED display board.

According to an embodiment of the present invention, a die-positioning method of an LED display board includes providing a substrate having a plurality of first, second, and third color pixel regions on a conveyor device. An LED die supply device is provided for providing a plurality of first, second, and third color LED dies. A first die-positioning device, a second die-positioning device, and a third die-positioning device are provided. The first, second, and third die-positioning devices are rotatably located above the conveyor device for respectively sucking to the first, second, and third color LED dies that are on the LED die supply device and releasing the first, second, and third color LED dies on the first, second, and third color pixel regions of the substrate.

In an embodiment of the present invention, the first, second, and third color LED dies are respectively red, green, and blue dies.

In an embodiment of the present invention, the substrate further includes a fourth color pixel region.

In an embodiment of the present invention, the die supply device further includes a plurality of fourth color LED dies.

In an embodiment of the present invention, the die-positioning device further includes a fourth roller body for sucking to the fourth color LED dies that are on the LED die supply device and releasing the fourth color LED dies on the fourth color pixel region of the substrate.

In an embodiment of the present invention, the fourth color LED dies are yellow dies.

In the aforementioned embodiments of the present invention, since the gas control device is connected to the chambers of the roller body, and the gas control device can selectively supply a suction force to a specific chamber, when the die-positioning device is used, each of the die suction regions on the specific suction chamber can suck an LED die to the corresponding die suction region by the corresponding gas channel. As a result, when the gas control device stops sucking the air from the specific suction chamber, the sucked die can be released to a predetermined position.

Moreover, the die-positioning system includes the conveyor device, the die supply device, and the die-positioning device. In use, the roller body of the die-positioning device is rotated above the conveyor device. When the dies on the die supply device is adjacent to or in contact with the die-suction portions, the dies can be sucked to by the die-suction portions. Thereafter, the substrate having the die-disposing region is transmitted to a position under the die-positioning device by the conveyor device. When the sucked dies are adjacent to or in contact with the die-disposing region of the substrate, the sucked dies can be released on the die-disposing region of the substrate by the die-suction portions.

Dies can be used as is by the die-positioning device and the die-positioning system, and the dies do not need to be arranged beforehand, as long as the locations of the die-suction portions on the surface of the roller body are designed to correspond to the die-disposing regions of the substrate. Therefore, limitations with respect to the dies are reduced by the die-positioning device and the die-positioning system, usability and production capacity can be improved, and manufacturing costs can be reduced.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
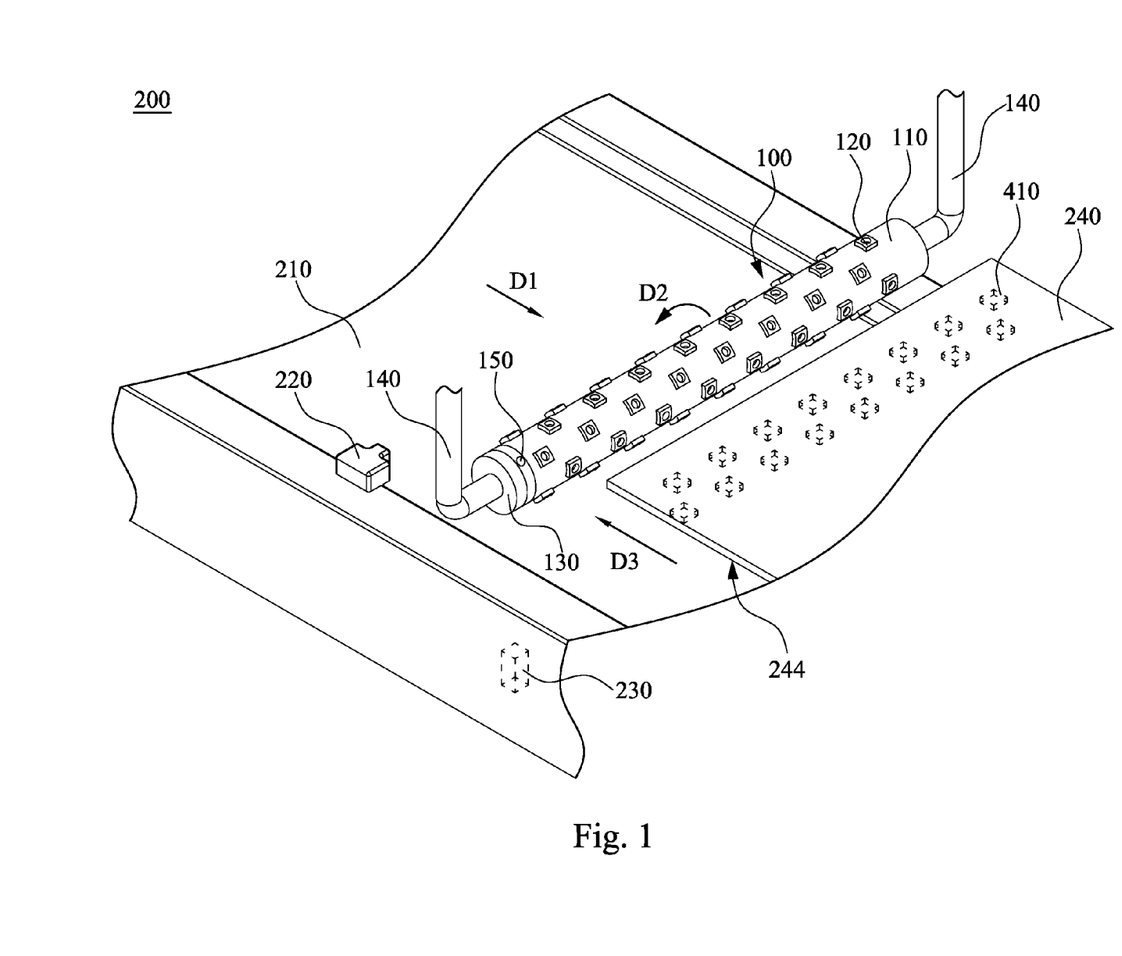
FIG. 1 is a perspective view of a die-positioning system according to an embodiment of the present invention.

FIG. 1 is a perspective view of a die-positioning system 200 according to an embodiment of the present invention. The die-positioning system 200 includes a conveyor device 210, a die-positioning device 100, and a die supply device 240. The conveyor device 210 can transmit a substrate that is to-be mounted with LED dies in a direction D1. The die-positioning device 100 can rotate in a direction D2 above the conveyor device 210. The die supply device 240 can move in a direction D3 to a position that is above the die-positioning device 100, and plural dies 410 are disposed on a surface 244 of the die supply device 240. The surface 244 may be a blue tape having the property of sticking, such that the LED dies 410 can be sticked to the surface 244.

Figure 2:
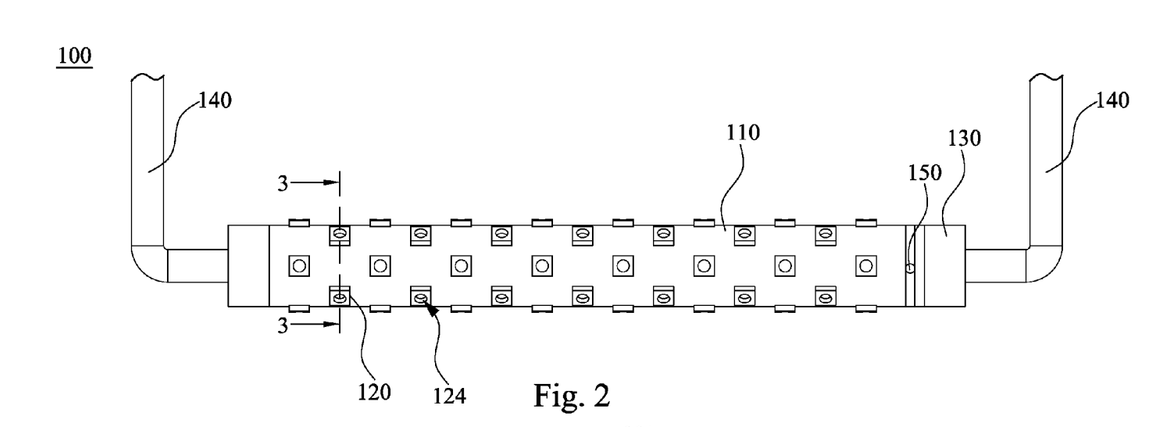
FIG. 2 is a front view of a die-positioning device shown in FIG. 1 seen from a direction D1.
Figure 3:
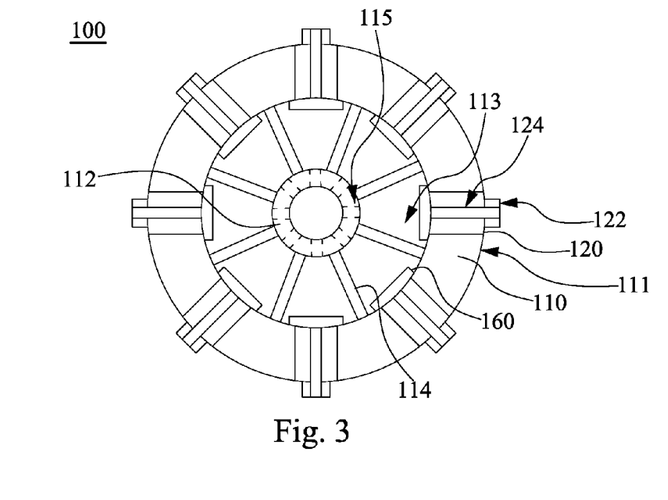
FIG. 3 is a cross-sectional view taken along line 3-3 of the die-positioning device in FIG. 2.

FIG. 2 is a front view of the die-positioning device 100 shown in FIG. 1 seen from the direction D1. FIG. 3 is a cross-sectional view taken along line 3-3 of the die-positioning device 100 in FIG. 2. As shown in FIG. 2 and FIG. 3, the die-positioning device 100 includes a roller body 110, a plurality of die-suction portions 120, and at least one gas control device 130. The roller body 110 includes a plurality of chambers 113 therein, and the chambers 113 are separated from each other. The die-suction portions 120 are located on a surface 111 of the roller body 110 in columns. That is, the die-suction portions 120 are disposed in columns that are substantially along a direction perpendicular to the direction D1, and the die-suction portions 120 are spaced apart in each of the columns. Moreover, the die-suction portions 120 for each column correspond to one of the chambers 113. Each of the die-suction portions 120 has a die suction region 122 and a gas channel 124 that passes through the die suction region 122. The die-suction portions 122 protrude from the surface 111 of the roller body 110, and can be used to suck the dies 410 (see FIG. 1). The gas control device 130 is connected to the chambers 113 and disposed on the roller body 110.

In this embodiment, the gas control device 130 is located on an end of the roller body 110, and may include a pump. The roller body 110 includes a gas transmission pipe 112 and a plurality of baffle boards 114. The gas transmission pipe 112 is located in the roller body 110, and can communicate the gas control device 130 and the chambers 113. The baffle boards 114 are located in the roller body 110 and surround the gas transmission pipe 112 with intervals therebetween to form the chambers 113. Moreover, the die-positioning device 100 may further include a plurality of solenoid valves 160. Each of the solenoid valves 160 can be disposed between one of the chambers 113 and the gas channels 124 of the die-suction portions 120 corresponding to the chamber 113. As a result, when the gas control device 130 connected to the gas transmission pipe 112 creates a suction force, the chambers 113 also create a suction force via the through holes 115, and the solenoid valves 160 can independently control the gas channels 124 to create a suction force or not.

Additionally, the die-positioning device 100 may further include a clamping element 140 and a position check mark 150. The clamping element 140 is connected to two ends of the roller body 110 to drive the roller body 110 to rotate. The position check mark 150 is fixed on the roller body 110 and rotates with the roller body 110.

Referring to FIG. 1 and FIG. 3, the die-positioning device 100 is rotatably located above the conveyor device 210 and rotates in the direction D2. The die supply device 240 moves in the direction D3. When the dies 410 on the die supply device 240 are adjacent to or in contact with the die suction regions 122 of the die-suction portions 120, the gas control device 130 selectively sucks the air from a specific chamber 113, such that each of the die suction regions 122 of the die-suction portions 120 on the specific chamber 113 can suck one of the dies 410 by the corresponding gas channel 124. Thereafter, the die supply device 240 can separate from the die-positioning device 100, as shown in FIG. 4.

Figure 4:
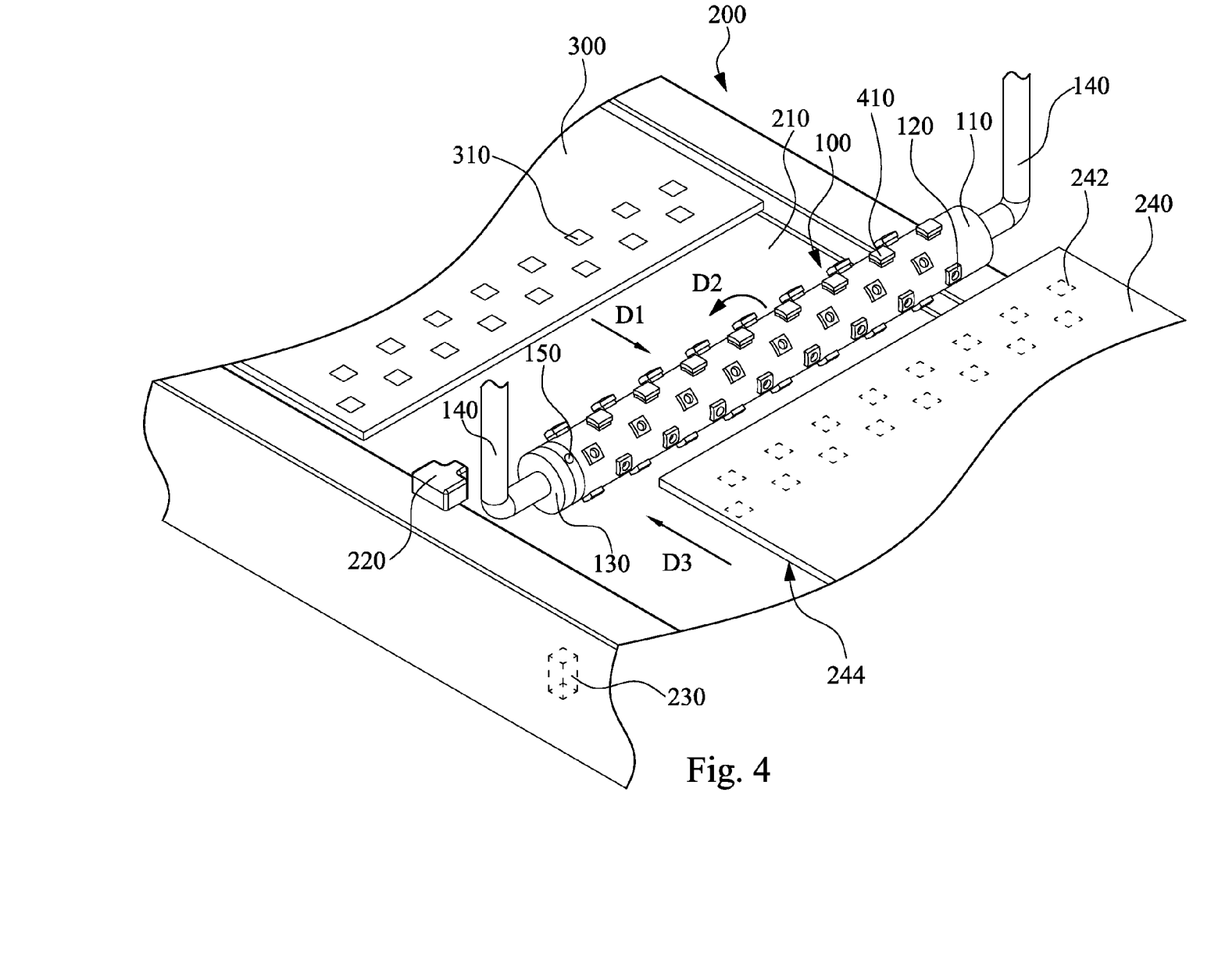
FIG. 4 is a perspective view of the die-positioning system shown in FIG. 1 when the die-positioning system is operated.

FIG. 4 is a perspective view of the die-positioning system 200 shown in FIG. 1 when the die-positioning system 200 is operated. Regions 242 of the die supply device 240 are positions that the dies 410 have not yet be sucked by the die-suction portions 120 of the die-positioning device 100. After the die-suction portions 120 suck the dies 410, the conveyor device 210 can transmit a substrate 300 having plural die-disposing regions 310 in the direction D1. When the substrate 300 is transmitted to a position under the die-positioning device 100, the sucked dies 410 are adjacent to or in contact with the die-disposing regions 310 of the substrate 300. In this state, the gas control device 130 can stop sucking the air from the specific chamber 113, such that the sucked dies 410 are released to predetermined positions. The "predetermined positions" refer to the die-disposing regions 310 where the dies 410 need to be mounted.

The die supply device 240 is used to supply the dies 410, which are located at the predetermined positions on the substrate 300. The die-positioning device 100 is rotatably located above the conveyor device 210 to suck the dies 410 that are on the die supply device 240 and release the dies 410 onto the die-disposing regions 310 of the substrate 300. That is to say, the die-positioning device 100 and the die-positioning system 200 can position the dies 410 on the die-disposing regions 310 of the substrate 300. In this embodiment, the relative positions of the substrate 300 on the conveyor device 210, the dies 410 on the die supply device 240, and the die-positioning device 100 can be controlled by a position sensor 220 and a controller 230 electrically connected to the position sensor 220. For example, the position sensor 220 can detect the position check mark 150 of the die-positioning device 100 to determine a rotation state of the roller body 110. Furthermore, the operating timing of the gas control device 130 of the die-positioning device 100, the rotation timing of the roller body 110 being driven by the clamping element 140, and the switch-on and switch-off timing of the solenoid valves 160 (see FIG. 3) may also be controlled by the controller 230, but the present invention is not limited in this regard.

In this embodiment, the dies 410 may include light emitting diode (LED) dies having at least three different colors. For example, the dies 410 with different colors may be red, green, blue, or yellow LED dies as deemed necessary by designers. The dies 410, which are original raw material, can be directly used to manufacture products by the die-positioning device 100 and the die-positioning system 200. As long as the locations of the die-suction portions 120 on the surface of the roller body 110 are designed to correspond to the die-disposing regions 310 of the substrate 300, the dies 410 do not need to be arranged beforehand. Therefore, limitations with respect to the dies 410 are reduced for the die-positioning device 100 and the die-positioning system 200, usability and production capacity can be improved, and manufacturing costs can be reduced.

It is to be noted that the connection relationships of the elements described above will not be repeated in the following description, and only aspects related to the processes of the die-positioning device 100 releasing the dies 410 on the die-disposing regions 310 of the substrate 300 will be explained.

Figure 5:
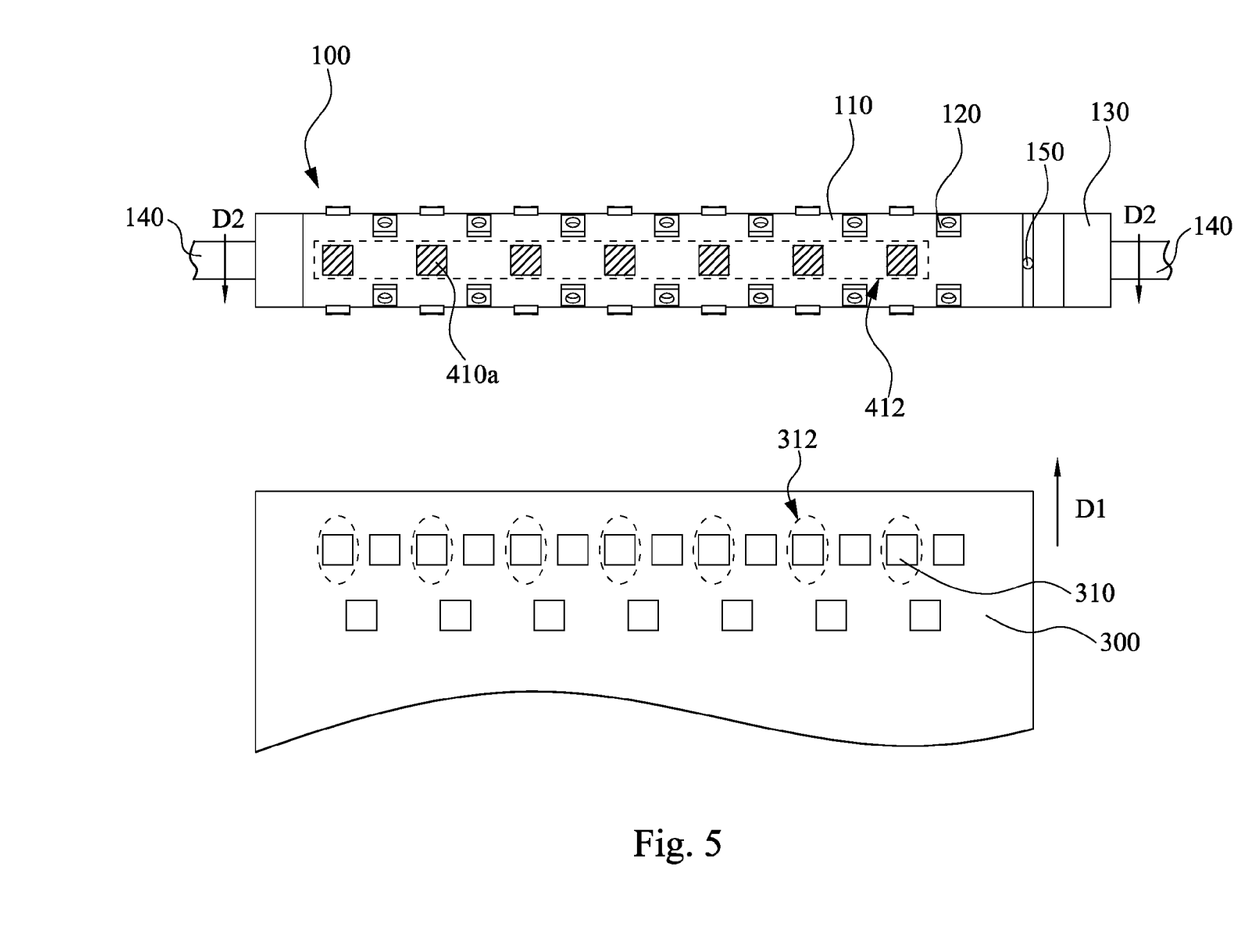
FIG. 5 is a top view of die-suction portions sucking first color LED dies.
Figure 6:
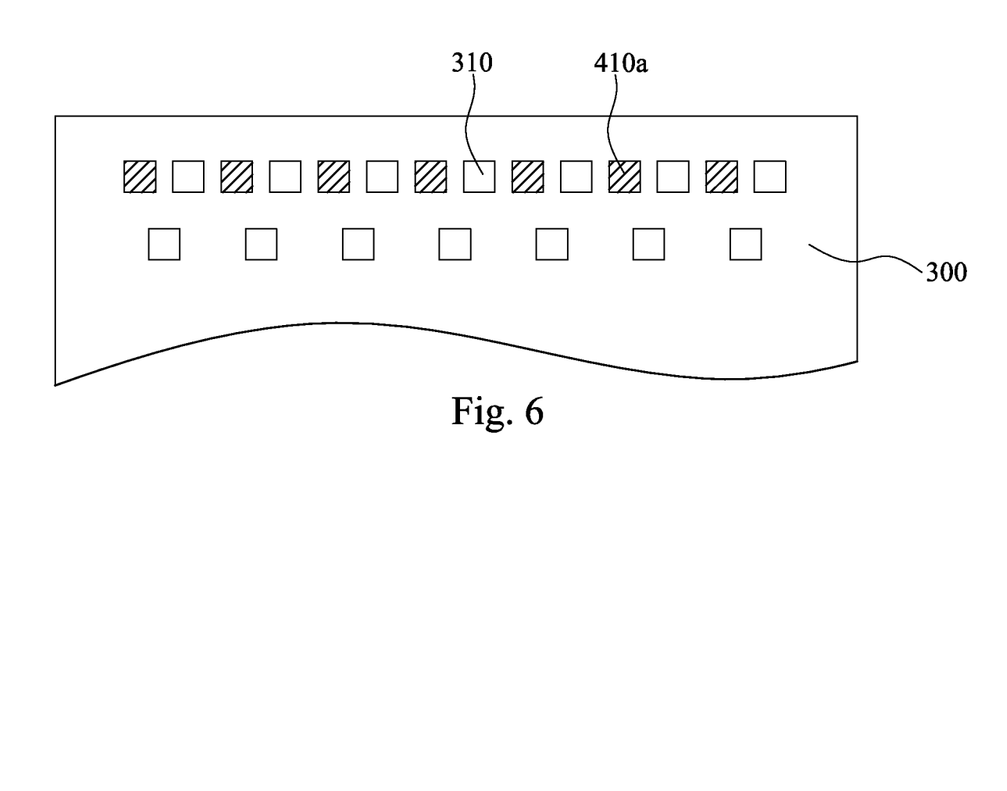
FIG. 6 is a top view of a substrate after the die-suction portions of FIG. 5 release the first color LED dies onto die-disposing regions of the substrate.

FIG. 5 is a top view of the die-suction portions 120 sucking the first color LED dies 410a. FIG. 6 is a top view of the substrate 300 after the die-suction portions 120 of FIG. 5 release the first color LED dies 410a onto the die-disposing regions 310 of the substrate 300. As shown in FIG. 5 and FIG. 6, the substrate 300 is moved in the direction D1, and the roller body 110 is rotated in the direction D2. The die-suction portions 120 within a region 412 (i.e., a column thereof) suck the first color LED dies 410a. The first color LED dies 410a need to be mounted on the die-disposing regions 310 within first color pixel regions 312. When the substrate 300 is moved to a position that is under the die-positioning device 100, the sucked first color LED dies 410a are adjacent to or in contact with the die-disposing regions 310 within the first color pixel regions 312. In this state, the gas control device 130 can stop sucking the air of the die-suction portions 120 within the region 412, such that the first color LED dies 410a can be released onto the die-disposing regions 310 within the first color pixel regions 312, as shown in FIG. 6. In this embodiment, the first color LED dies 410a may be red dies.

Figure 7:
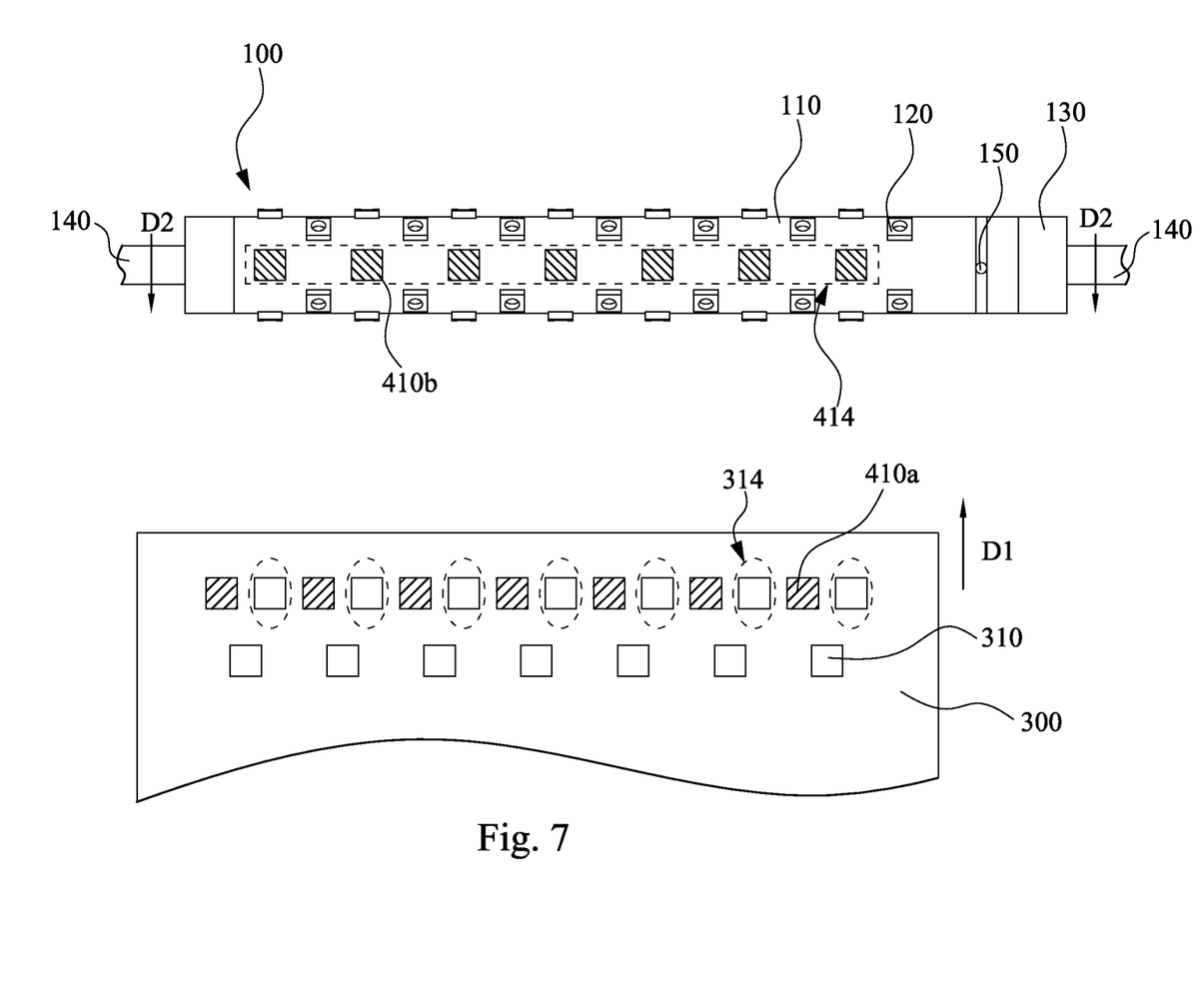
FIG. 7 is a top view of the die-suction portions sucking second color LED dies.
Figure 8:
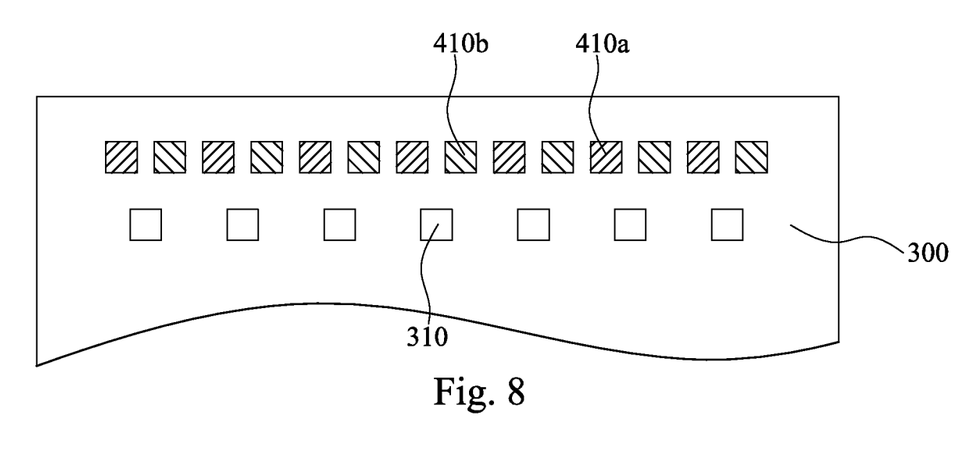
FIG. 8 is a top view of the substrate after the die-suction portions of FIG. 7 release the second color LED dies onto the die-disposing regions of the substrate.

FIG. 7 is a top view of the die-suction portions 120 sucking second color LED dies 410b. FIG. 8 is a top view of the substrate 300 after the die-suction portions 120 of FIG. 7 release the second color LED dies 410b onto the die-disposing regions 310 of the substrate 300. As shown in FIG. 7 and FIG. 8, which are similar to FIG. 5 and FIG. 6, the substrate 300 is moved in the direction D1, and the roller body 110 is rotated in the direction D2, but the first color LED dies 410a have been mounted on a portion of the die-disposing regions 310. The die-suction portions 120 within a region 414 (i.e., a column thereof) suck the second color LED dies 410b. The second color LED dies 410b need to be mounted on the die-disposing regions 310 within second color pixel regions 314. When the substrate 300 is moved to a position that is under the die-positioning device 100, the sucked second color LED dies 410b are adjacent to or in contact with the die-disposing regions 310 within the second color pixel regions 314. In this state, the gas control device 130 can stop sucking the air from the die-suction portions 120 within the region 414, such that the second color LED dies 410b can be released onto the die-disposing regions 310 within the second color pixel regions 314, as shown in FIG. 8. In this embodiment, the second color LED dies 410b may be green dies.

Figure 9:
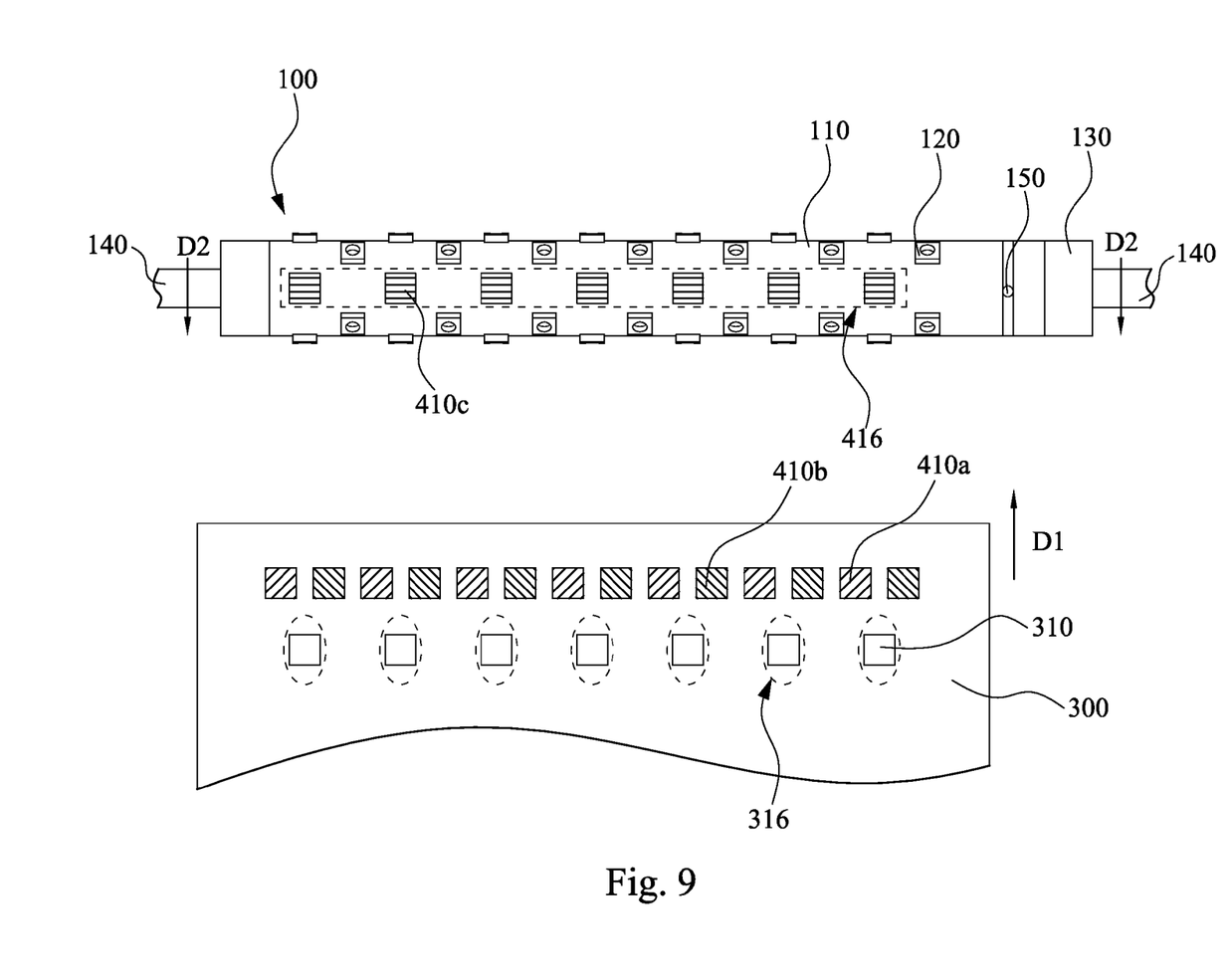
FIG. 9 is a top view of the die-suction portions sucking third color LED dies.
Figure 10:
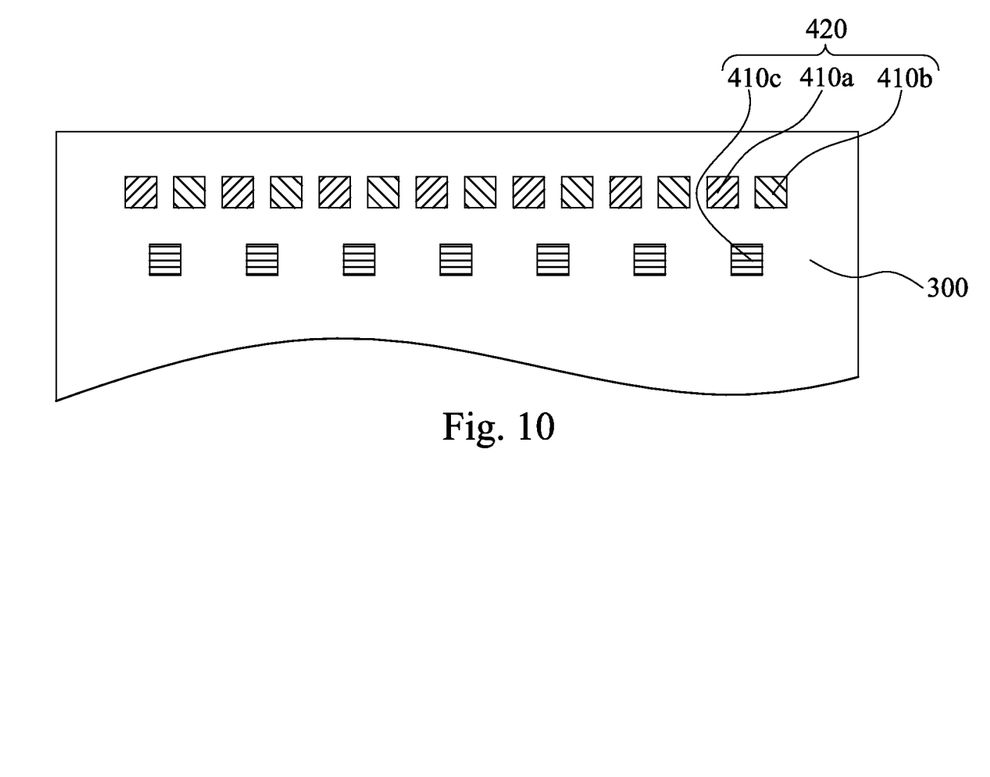
FIG. 10 is a top view of the substrate after the die-suction portions of FIG. 9 release the third color LED dies onto the die-disposing regions of the substrate.

FIG. 9 is a top view of the die-suction portions 120 sucking third color LED dies 410c. FIG. 10 is a top view of the substrate 300 after the die-suction portions 120 of FIG. 9 release the third color LED dies 410c onto the die-disposing regions 310 of the substrate 300. As shown in FIG. 9 and FIG. 10, which are similar to FIG. 7 and FIG. 8, the substrate 300 is moved in the direction D1, and the roller body 110 is rotated in the direction D2, but the first and second color LED dies 410a, 410b have been mounted on a portion of the die-disposing regions 310. The die-suction portions 120 within a region 416 (i.e., a column thereof) suck the third color LED dies 410c. The third color LED dies 410c need to be mounted on the die-disposing regions 310 within third color pixel regions 316. When the substrate 300 is moved to a position that is under the die-positioning device 100, the sucked third color LED dies 410c are adjacent to or in contact with the die-disposing regions 310 within the third color pixel regions 316. In this state, the gas control device 130 can stop sucking the air from the die-suction portions 120 within the region 416, such that the third color LED dies 410c can be released onto the die-disposing regions 310 within the third color pixel regions 316, as shown in FIG. 10. In this embodiment, the third color LED dies 410c may be blue dies.

As a result, a pixel 420 can be formed by each of the adjacent first, second, and third color LED dies 410a, 410b, 410c.

Figure 11:
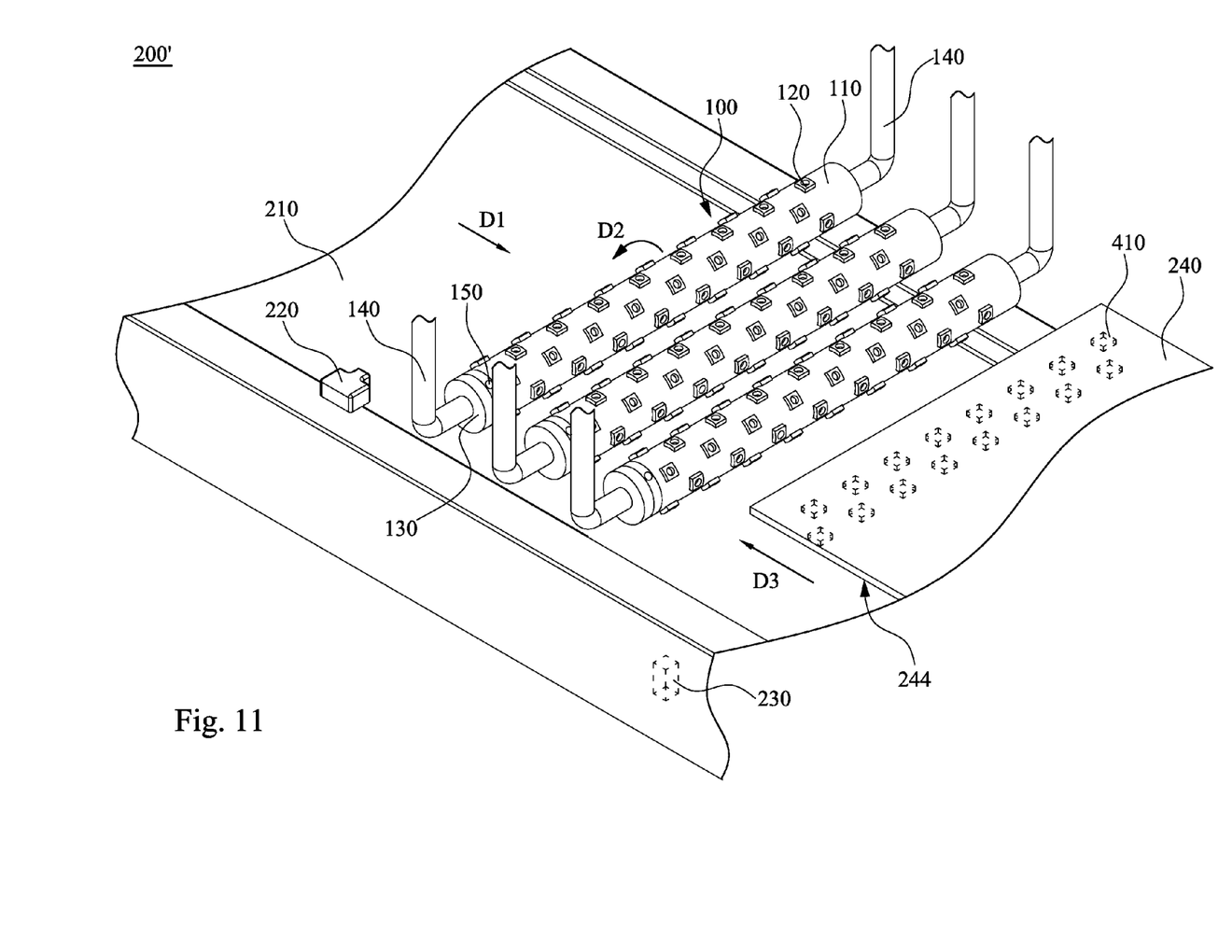
FIG. 11 is a perspective view of a die-positioning system according to an embodiment of the present invention.

FIG. 11 is a perspective view of a die-positioning system 200' according to an embodiment of the present invention. As shown in FIG. 10 and FIG. 11, the die-positioning system 200' includes the conveyor device 210, three die-positioning devices 100, and the die supply device 240. When the die-positioning system 200' is operated, the three die-positioning devices 100 can respectively suck the first, second, and third color LED dies 410a, 410b, 410c. Thereafter, the substrate 300 only needs to be moved in the direction D1 to a position that is under the three die-positioning devices 100 in sequence, after which the three die-positioning devices 100 can respectively release the first, second, and third color LED dies 410a, 410b, 410c on predetermined positions of the substrate 300, such that the pixel 420 (see FIG. 10) can be formed by the adjacent first, second, and third color LED dies 410a, 410b, 410c.

Figure 12:
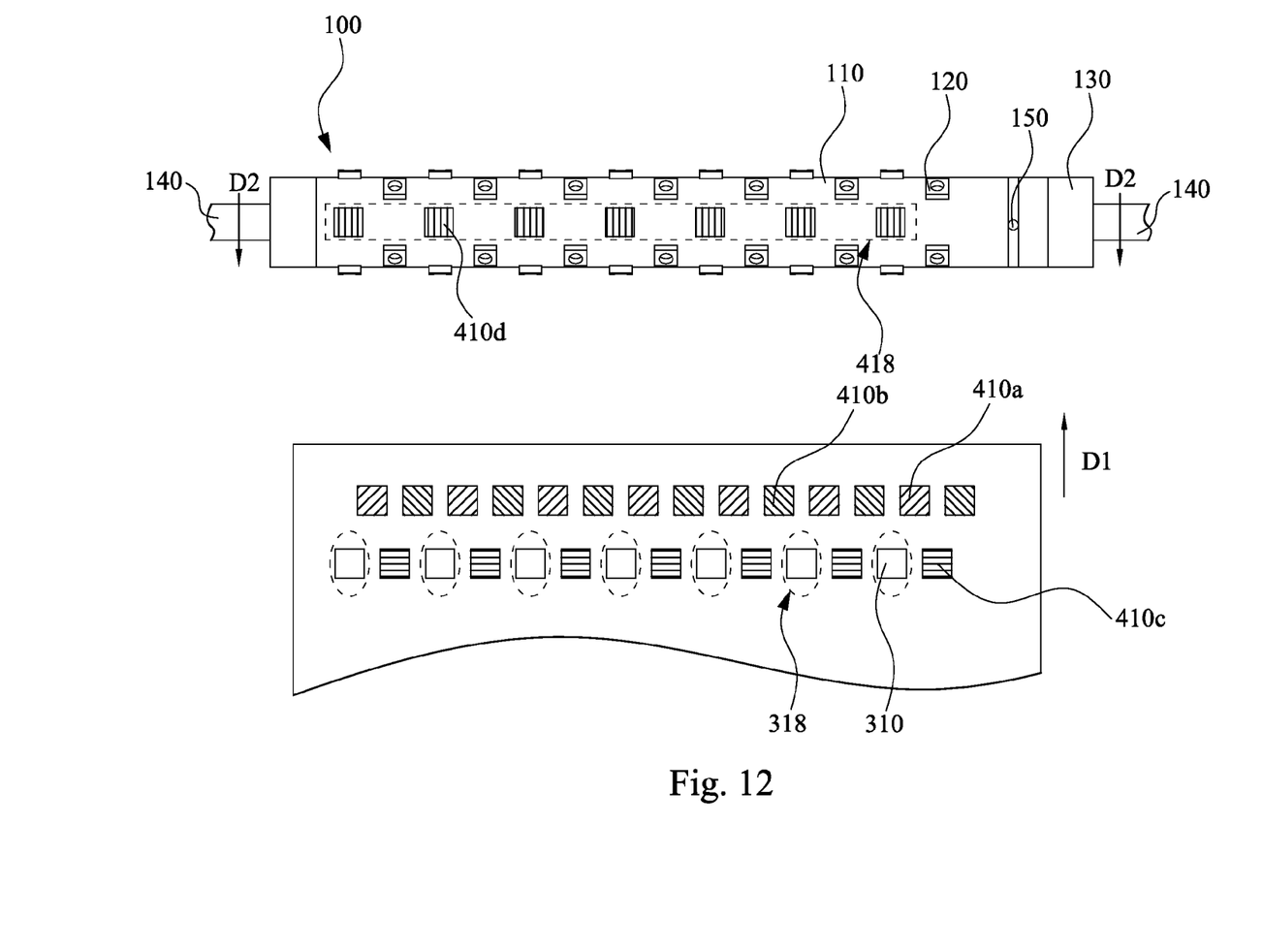
FIG. 12 is a top view of the die-suction portions sucking fourth color LED dies.
Figure 13:
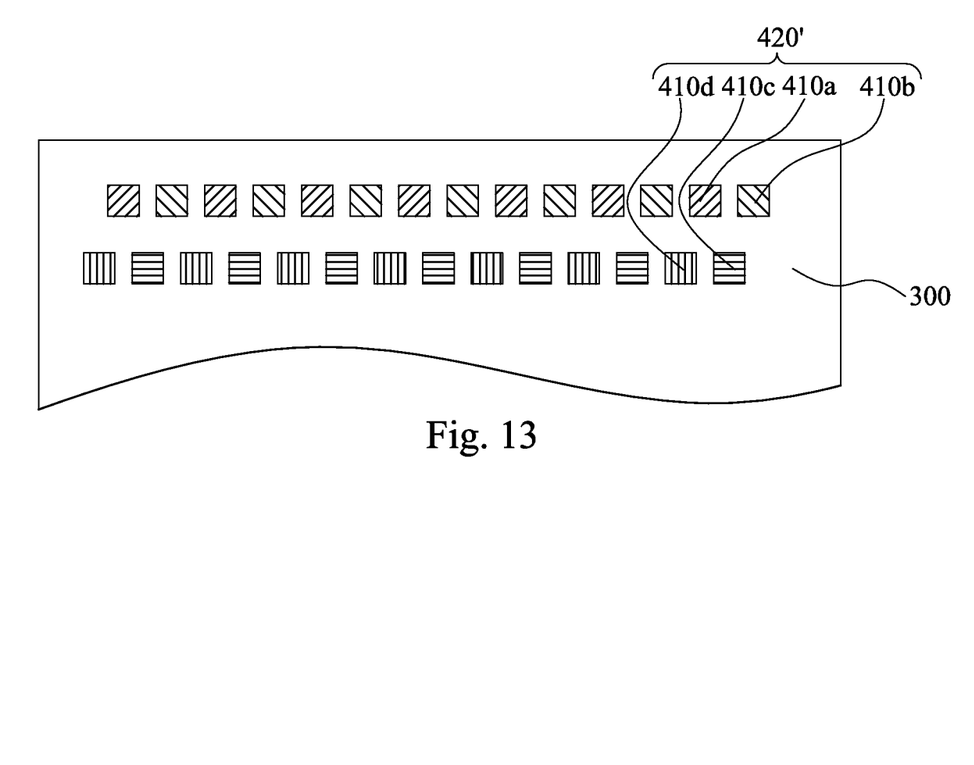
FIG. 13 is a top view of the substrate after the die-suction portions of FIG. 12 release the fourth color LED dies onto the die-disposing regions of the substrate.

FIG. 12 is a top view of the die-suction portions 120 sucking fourth color LED dies 410d. FIG. 13 is a top view of the substrate 300 after the die-suction portions 120 of FIG. 12 release the fourth color LED dies 410d onto the die-disposing regions 310 of the substrate 300. As shown in FIG. 12 and FIG. 13, the substrate 300 is moved in the direction D1, and the roller body 110 is rotated in the direction D2, but the first, second, and third color LED dies 410a, 410b, 410c have been mounted on a portion of the die-disposing regions 310. The die-suction portions 120 within a region 418 (i.e., a column thereof) suck the fourth color LED dies 410d. The fourth color LED dies 410d need to be mounted on the die-disposing regions 310 within fourth color pixel regions 318. When the substrate 300 is moved to a position that is under the die-positioning device 100, the sucked fourth color LED dies 410d are adjacent to or in contact with the die-disposing regions 310 within the fourth color pixel regions 318. In this state, the gas control device 130 can stop sucking the air from the die-suction portions 120 within the region 418, such that the fourth color LED dies 410d can be released onto the die-disposing regions 310 within the fourth color pixel regions 318, as shown in FIG. 13. In this embodiment, the fourth color LED dies 410d may be yellow dies.

As a result, a pixel 420' can be formed by each of the adjacent first, second, third, and fourth color LED dies 410a, 410b, 410c, 410d.

Figure 14:
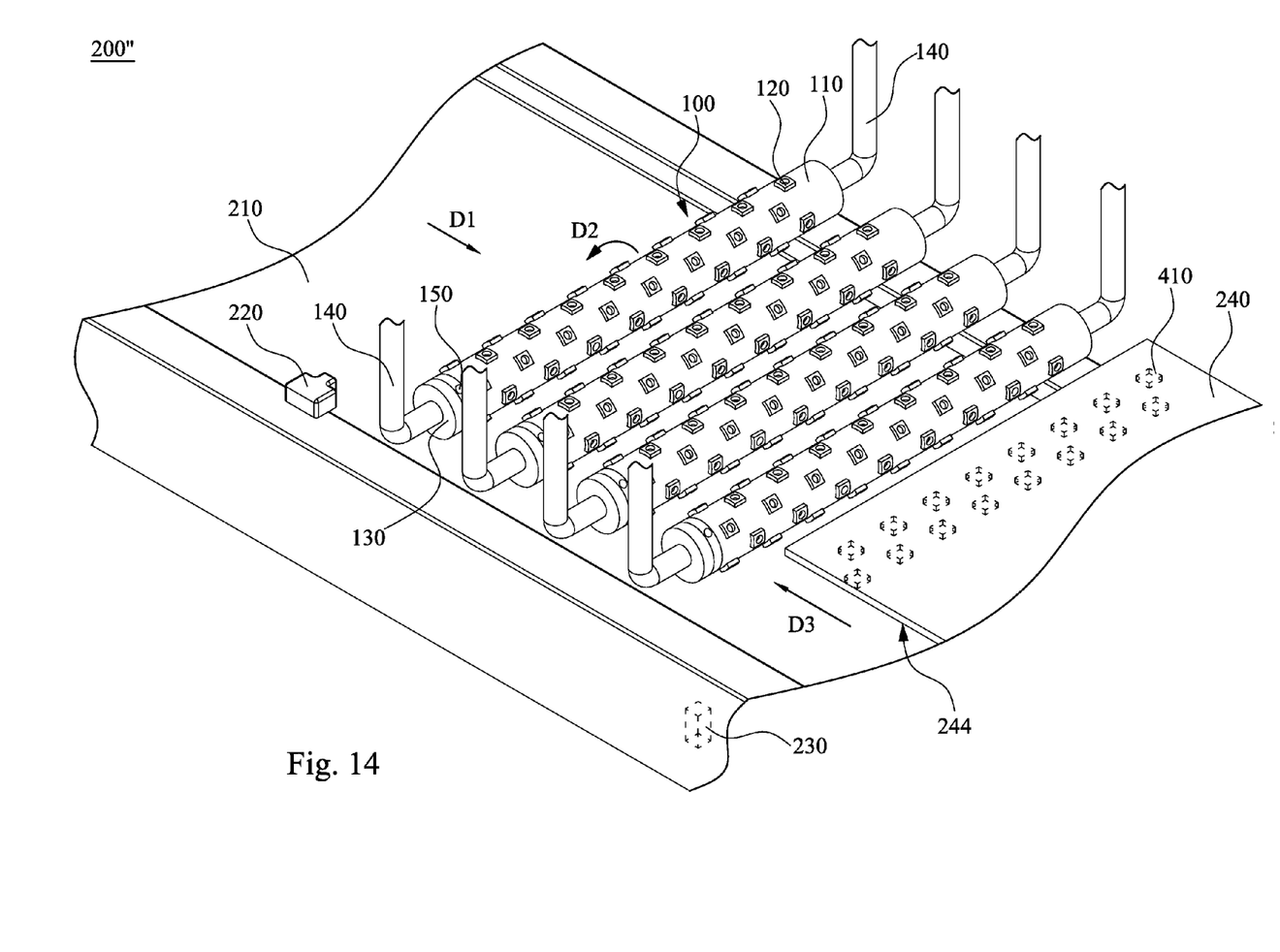
FIG. 14 is a perspective view of a die-positioning system according to an embodiment of the present invention.

FIG. 14 is a perspective view of a die-positioning system 200" according to an embodiment of the present invention. As shown in FIG. 13 and FIG. 14, the die-positioning system 200" includes the conveyor device 210, four die-positioning devices 100, and the die supply device 240. When the die-positioning system 200" is operated, the four die-positioning devices 100 can respectively suck the first, second, third, and fourth color LED dies 410a, 410b, 410c, 410d. Thereafter, the substrate 300 only needs to be moved in the direction D1 to a position that is under the four die-positioning devices 100 in sequence, after which the four die-positioning devices 100 can respectively release the first, second, third, and fourth color LED dies 410a, 410b, 410c, 410d on predetermined positions of the substrate 300, such that a pixel 420' (see FIG. 13) can be formed by the adjacent first, second, third, and fourth color LED dies 410a, 410b, 410c, 410d.

Figure 15:
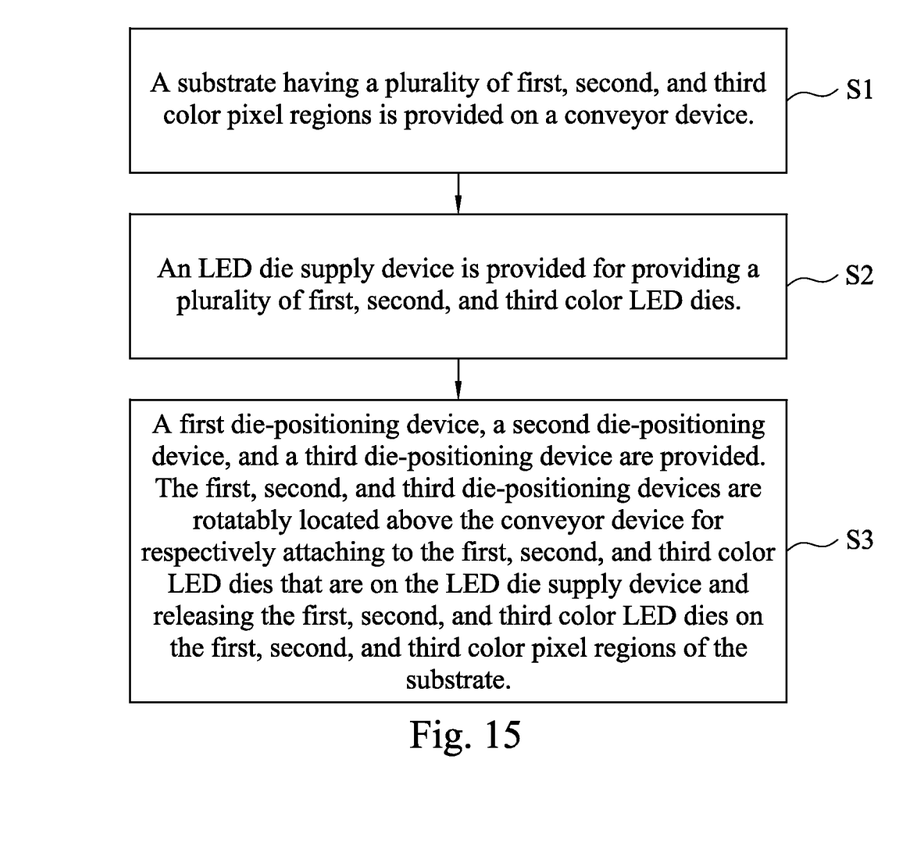
FIG. 15 is a flow chart of a die-positioning method of an LED display board according to an embodiment of the present invention.

FIG. 15 is a flow chart of a die-positioning method of an LED display board according to an embodiment of the present invention. The die-positioning method of the LED display board includes a number of steps. In step S1, a substrate having a plurality of first, second, and third color pixel regions is provided on a conveyor device. In step S2, an LED die supply device is provided for providing a plurality of first, second, and third color LED dies. Finally in step S3, a first die-positioning device, a second die-positioning device, and a third die-positioning device are provided. The first, second, and third die-positioning devices are rotatably located above the conveyor device for respectively sucking the first, second, and third color LED dies that are on the LED die supply device and releasing the first, second, and third color LED dies on the first, second, and third color pixel regions of the substrate.

The die supply device may further include a plurality of fourth color LED dies, and the fourth color LED dies may be yellow dies. The die-positioning device may further include a fourth roller body for sucking the fourth color LED dies that are on the LED die supply device and releasing the fourth color LED dies on fourth color pixel regions of the substrate.

Compared with the prior art, dies can be used as is by the die-positioning device and the die-positioning system, and the dies do not need to be arranged beforehand, as long as the locations of the die-suction portions on the surface of the roller body are designed to correspond to the die-disposing region of the substrate. Therefore, limitations with respect to the dies are reduced by the die-positioning device and the die-positioning system, usability and production capacity can be improved, and manufacturing costs can be reduced.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A die-positioning device for positioning a plurality of dies on at least one die-disposing region of a substrate, wherein the die-positioning device comprises:
   a roller body having a plurality of chambers therein, and comprising a gas transmission pipe and a plurality of baffle boards, wherein the chambers are separated from each other, and the baffle boards are located in the roller body and surround the gas transmission pipe with intervals therebetween to form the chambers;
   a plurality of die-suction portions located on a surface of the roller body in columns, wherein the die-suction portions for each column correspond to one of the chambers, and each of the die-suction portions has a die suction region and a gas channel passing through the die suction region; and
   at least one gas control device connected to the chambers and disposed on the roller body, wherein the gas transmission pipe is located in the roller body for communicating the gas control device and the chambers, and the gas control device selectively sucks the air from a specific chamber, such that each of the die-suction portions on the specific chamber sucks one of the dies by the corresponding gas channel, and when the gas control device stops sucking the air from the specific chamber, the sucked die is released to a predetermined position.

2. The die-positioning device of claim 1, further comprising:
   a clamping element connected to two ends of the roller body for driving the roller body to rotate.

3. The die-positioning device of claim 1, wherein the gas control device is located on an end of the roller body.

4. The die-positioning device of claim 1, wherein the gas control device comprises a pump.

5. The die-positioning device of claim 1, further comprising:
   a position check mark fixed on the roller body.

6. The die-positioning device of claim 1, wherein the die-suction portions protrude from the surface of the roller body.

7. The die-positioning device of claim 1, further comprising:
   a plurality of solenoid valves, wherein each of the solenoid valves is disposed between one of the chambers of the roller body and the gas channels of the die-suction portions corresponding to the chamber.

8. A die-positioning system for positioning a plurality of dies on at least one die-disposing region of a substrate, wherein the die-positioning system comprises:
   a conveyor device for transmitting the substrate;
   a die supply device for providing the dies that are to be predeterminedly positioned on the substrate; and
   a die-positioning device as claimed in claim 1, wherein the die-positioning device is rotatably located above the conveyor device for sucking the dies that are on the die supply device and releasing the dies on the die-disposing region of the substrate.

9. The die-positioning system of claim 8, wherein the die-positioning device comprises:
   a clamping element connected to two ends of the roller body for driving the roller body to rotate.

10. The die-positioning system of claim 8, wherein the gas control device is located on an end of the roller body.

11. The die-positioning system of claim 8, wherein the gas control device comprises a pump.

12. The die-positioning system of claim 8, wherein the die-positioning device comprises:
   a position check mark fixed on the roller body.

13. The die-positioning system of claim 8, wherein the die-suction portions protrude from the surface of the roller body.

14. The die-positioning system of claim 8, wherein the die-positioning device comprises:
   a plurality of solenoid valves, wherein each of the solenoid valves is disposed between one of the chambers of the roller body and the gas channels of the die-suction portions corresponding to the chamber.

15. The die-positioning system of claim 8, wherein the dies comprise light emitting diode (LED) dies having at least three different colors.

16. The die-positioning system of claim 15, wherein the die-positioning device comprises at least three roller bodies, and each of the roller bodies is for sucking the LED dies with one of the colors and releasing the LED dies on a predetermined position of the substrate.

17. A die-positioning method of an LED display board, comprising the steps of:
   providing a substrate having a plurality of first, second, and third color pixel regions on a conveyor device;
   providing an LED die supply device for providing a plurality of first, second, and third color LED dies; and
   providing a first die-positioning device, a second die-positioning device, and a third die-positioning device as claimed in claim 1, wherein the first, second, and third die-positioning devices are rotatably located above the conveyor device for respectively attaching to the first, second, and third color LED dies that are on the LED die supply device and releasing the first, second, and third color LED dies on the first, second, and third color pixel regions of the substrate.

18. The die-positioning method of claim 17, wherein the first, second, and third color LED dies are respectively red, green, and blue dies.

19. The die-positioning method of claim 18, wherein the substrate further comprises a fourth color pixel region.

20. The die-positioning method of claim 19, wherein the die supply device further comprises a plurality of fourth color LED dies.

21. The die-positioning method of claim 20, further comprising:
   providing a fourth die-positioning device as claimed in claim 1, wherein the roller body of the fourth die-positioning device is for attaching to the fourth color LED dies that are on the LED die supply device and releasing the fourth color LED dies on the fourth color pixel region of the substrate.

22. The die-positioning method of claim 21, wherein the fourth color LED dies are yellow dies.

* * * * *